US009781362B1

United States Patent
Lin et al.

(10) Patent No.: US 9,781,362 B1
(45) Date of Patent: Oct. 3, 2017

(54) FLARE-REDUCING IMAGING SYSTEM AND ASSOCIATED IMAGE SENSOR

(71) Applicant: OmniVision Technologies, Inc., Santa Clara, CA (US)

(72) Inventors: Chao-Hung Lin, San Ramon, CA (US); Hong Jun Li, San Jose, CA (US); Ping-Hsu Chen, San Jose, CA (US); Denis Chu, Fremont, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/076,911

(22) Filed: Mar. 22, 2016

(51) Int. Cl.
*H04N 3/14* (2006.01)
*H04N 5/335* (2011.01)
*H04N 5/225* (2006.01)
*H04N 5/357* (2011.01)
*H01L 27/146* (2006.01)

(52) U.S. Cl.
CPC ..... *H04N 5/3572* (2013.01); *H01L 27/14618* (2013.01); *H01L 27/14627* (2013.01); *H01L 27/14632* (2013.01)

(58) Field of Classification Search
CPC . H01L 2224/48227; H01L 2224/48247; H01L 2224/48257; H01L 2224/48463; H01L 24/48; H01L 2224/73265; H01L 33/486; H01L 21/67138; H01L 2224/49112; H01L 24/78; H01L 24/85; H04N 5/2257; H04N 5/369; G06F 1/183
See application file for complete search history.

(56) References Cited

U.S. PATENT DOCUMENTS

| 5,424,838 | A | * | 6/1995 | Siu | G01N 21/95684 250/559.4 |
| 5,535,006 | A | * | 7/1996 | Telschow | G01N 21/8806 250/559.01 |
| 5,576,828 | A | * | 11/1996 | Tomiyama | G01N 21/95684 250/559.34 |
| 5,621,218 | A | * | 4/1997 | Tanaka | G01N 21/95684 250/559.22 |
| 7,145,162 | B2 | * | 12/2006 | Cheng | G01B 11/026 250/559.34 |
| 7,627,241 | B2 | * | 12/2009 | Okita | G01N 21/95684 250/559.34 |
| 9,018,728 | B2 | | 4/2015 | Iwafuchi et al. | |
| 2003/0122061 | A1 | * | 7/2003 | Kawano | H01S 5/02252 250/214 R |

(Continued)

*Primary Examiner* — Chia-Wei A Chen
(74) *Attorney, Agent, or Firm* — Lathrop & Gage LLP (57) ABSTRACT

An image sensor capable of capturing an image formed by a lens includes a substrate and a bonding wire. The substrate has a pixel array and a bonding pad on a top surface of the substrate between the pixel array and a substrate edge. The bonding wire is electrically connected to the bonding pad and has a region forming a non-zero angle with respect to the substrate top surface. The non-zero angle is in at least one of a lower and an upper angular range for minimizing reflection of incident light on the region from reaching the image sensor. The lower angular range is selected such that the region reflects the incident light away from the pixel array toward a plane including the lens. The upper angular range is selected such that the region reflects the incident light to a clearance between the bonding pad and the pixel array.

17 Claims, 10 Drawing Sheets

(56) References Cited

U.S. PATENT DOCUMENTS

| | | | |
|---|---|---|---|
| 2006/0237722 A1* | 10/2006 | Matsuda | H01L 27/14818 257/59 |
| 2007/0190691 A1* | 8/2007 | Humpston | B81C 1/00269 438/113 |
| 2008/0137331 A1* | 6/2008 | Kaneko | F21K 9/00 362/231 |
| 2011/0133217 A1* | 6/2011 | Hakamata | F21S 48/1109 257/88 |
| 2012/0104438 A1* | 5/2012 | Wang | H01L 33/62 257/98 |
| 2012/0249822 A1* | 10/2012 | Yoshida | H01L 27/14618 348/222.1 |
| 2012/0257075 A1* | 10/2012 | Kamada | H01L 27/14618 348/222.1 |
| 2013/0056448 A1* | 3/2013 | Kim | H01L 24/78 219/121.63 |
| 2014/0159186 A1* | 6/2014 | Nakamura | H01L 27/14625 257/435 |
| 2014/0375852 A1* | 12/2014 | Ogino | H01L 27/14627 348/294 |
| 2015/0221702 A1* | 8/2015 | Jung | H01L 27/307 257/40 |
| 2016/0365330 A1* | 12/2016 | Hagiwara | H01L 24/85 |
| 2017/0017335 A1* | 1/2017 | Takahashi | G06F 3/044 |

* cited by examiner

FLARE-REDUCING IMAGING SYSTEM AND ASSOCIATED IMAGE SENSOR

BACKGROUND

Figure 1:
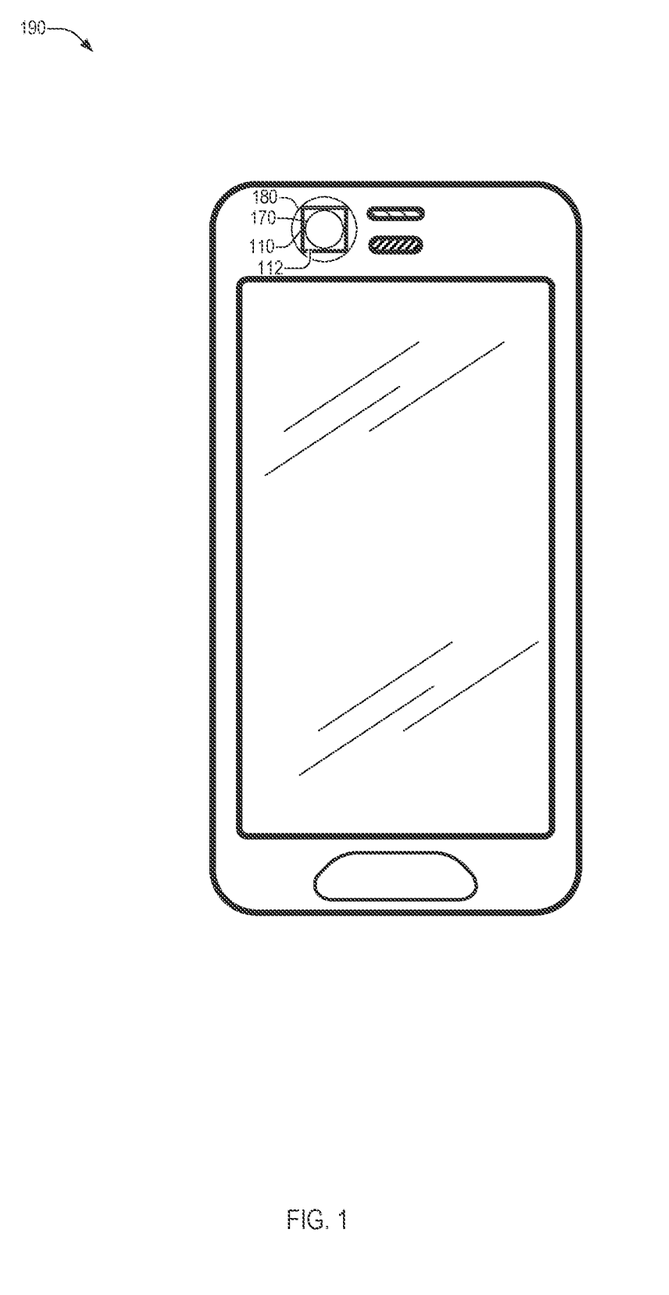
FIG. 1 shows a mobile device having a camera module integrated therein.

High-volume consumer products such as mobile devices and motor vehicles often include at least one digital camera. For example, FIG. 1 shows a mobile device 190 having a camera module 180 integrated therein. Camera module 180 includes an image sensor 110 beneath a lens 170. Image sensor 110 includes a pixel array 112.

The quality of images captured by camera module 180 depends on many factors. One of these factors is the amount of stray light that reaches image sensor 110. One way to improve image quality is to minimize image artifacts caused by stray light, that is, to minimize light transmitted by lens 170 that reaches pixel array 112 via reflection from an element therebetween.

SUMMARY OF THE INVENTION

The embodiments disclosed herein include image sensors with improved image quality via elimination of stray light sources.

In a first aspect, a flare-reducing imaging system includes an image sensor, a lens, and a bonding wire. The image sensor has a pixel array formed on a top surface of a substrate that includes a bonding pad on the substrate top surface between the pixel array and an edge of the substrate. The lens is above the pixel array and has an optical axis orthogonal thereto. The bonding wire is electrically connected to the bonding pad and has a region that forms a non-zero angle with respect to the substrate top surface and extends away from the optical axis. The non-zero angle is in at least one of a lower and an upper angular range for minimizing reflection of incident light on the region from reaching the image sensor. The lower angular range is selected such that the region reflects the incident light away from the pixel array toward a plane including the lens. The upper angular range is selected such that the region reflects the incident light to a clearance between the bonding pad and the pixel array.

In a second aspect, a flare-reducing image sensor capable of capturing an image formed by a lens having an optical axis orthogonal thereto includes a substrate and a bonding wire. The substrate has a pixel array formed thereon, and includes a bonding pad on a top surface of the substrate between the pixel array and an edge of the substrate. The bonding wire is electrically connected to the bonding pad and has a region forming a non-zero angle with respect to the substrate top surface and extending away from the pixel array. The non-zero angle is in at least one of a lower and an upper angular range for minimizing reflection of incident light on the region from reaching the image sensor. The lower angular range is selected such that the region reflects the incident light away from the pixel array toward a plane including the lens. The upper angular range is selected such that the region reflects the incident light to a clearance between the bonding pad and the pixel array.

DETAILED DESCRIPTION OF THE EMBODIMENTS

Figure 2:
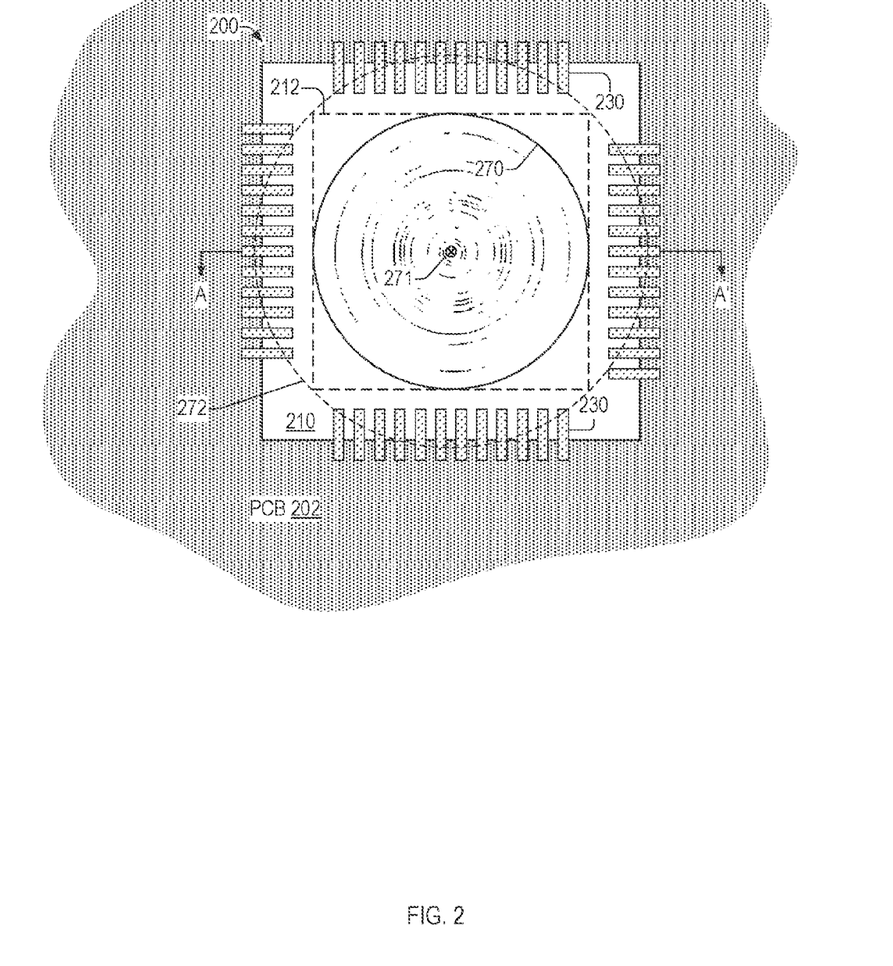
FIG. 2 is a plan view an imaging system that includes a lens and an image sensor.
Figure 3:
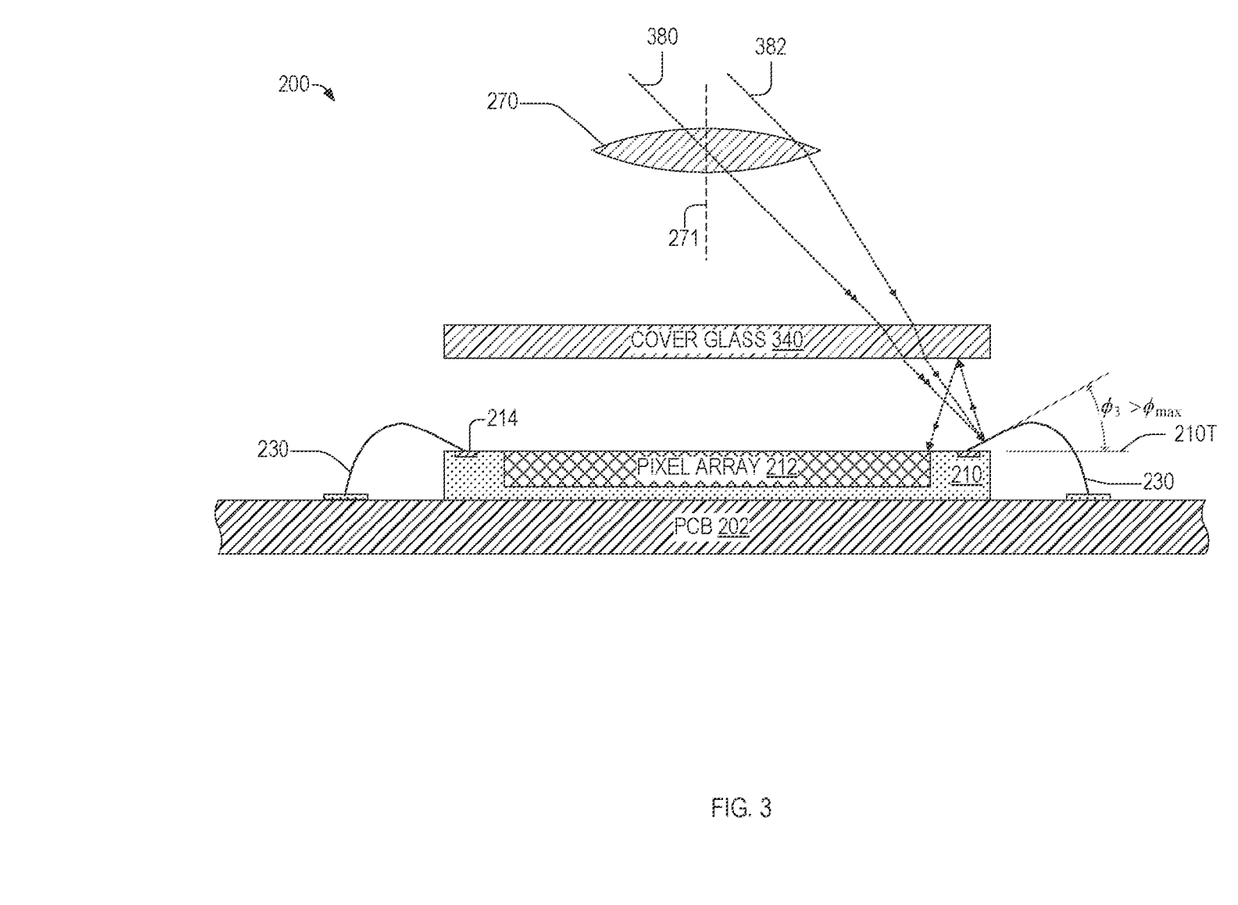
FIG. 3 is a cross-sectional view of the imaging system of FIG. 2 showing a path of light reflected by bonding wires connected to the image sensor.

FIG. 2 is a plan view and FIG. 3 is a cross-sectional view of an imaging system 200 that includes a lens 270 and an image sensor 210 configured such that imaging system 200 has an image circle 272. The cross-sectional view of FIG. 3 is along cross-section A-A' of FIG. 2. The cross-sectional view of FIG. 3 corresponds to cross-section A-A' of FIG. 2.

Image sensor 210 is electrically connected to a printed circuit board 202 (PCB) via a plurality of bonding wires 230 which are at least partially within image circle 272. Lens 270 has an optical axis 271 that is orthogonal to the plane of a pixel array 212 of image sensor 210. Image sensor 210 and lens 270 may function as image sensor 110 and lens 170 respectively of FIG. 1. FIGS. 2 and 3 are best viewed together in the following description.

As shown in FIG. 3, imaging system 200 includes a coverglass 340 between lens 270 and image sensor 210. Bonding wires 230 are connected to bonding pads 214 and form an angle $\Phi_3$ with respect to a plane 210T parallel to a top surface of image sensor 210. Since bonding wires 230 are at least partially within image circle 272, lens 270 is capable of transmitting a chief ray 380 and refracting an upper marginal ray 382 toward bonding wire 230. Angle $\Phi_3$ is sufficiently high such that upper marginal ray 382 reflects off of bonding wire 230 and coverglass 340 before being detected by a pixel of pixel array 112. Upper marginal ray 382 is hence a source of stray light and creates an artifact, referred to as bonding wire flare, in an image formed by lens 270 and detected by image sensor 210. Depending on the value of angle $\Phi_3$, chief ray 380 may also be reflected toward coverglass 340 and result in bonding wire flare.

Figure 4:
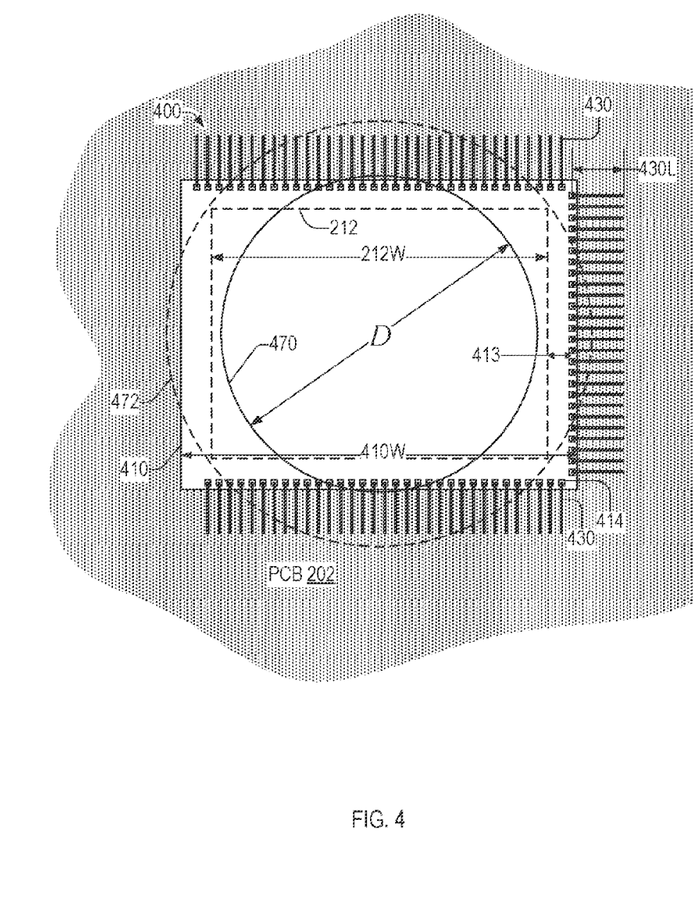
FIG. 4 is a plan view of a flare-reducing imaging system having a flare-reducing image sensor with bonding wires that reflect light away from the image sensor's pixel array, in an embodiment.
Figure 5:
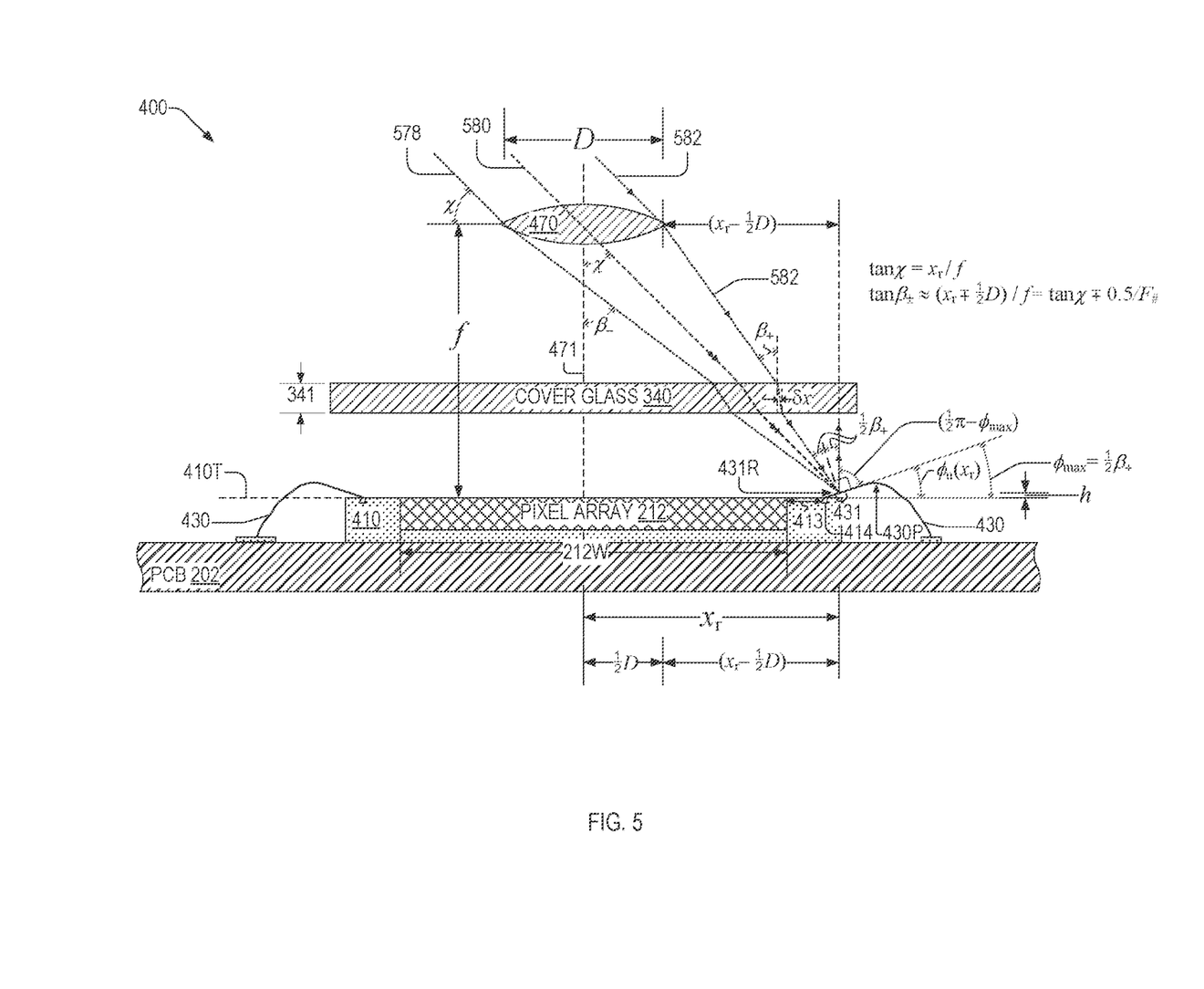
FIG. 5 is a cross-sectional view of the imaging system of FIG. 4 showing a path of light reflected by bonding wires, where the path is away from the image sensor, in an embodiment.

Applicant has discovered that bonding wire flare can be significantly reduced through strategic selection of angle $\Phi_3$, as shown hereinbelow. FIG. 4 is a plan view and FIG. 5 is a cross-sectional view of a flare-reducing imaging system 400 that includes a lens 470 above a flare-reducing image sensor 410 configured such that flare-reducing imaging system 400 has an image circle 472. FIGS. 4 and 5 are best viewed together in the following description. Flare-reducing image sensor 410 is electrically connected to a printed circuit board 202 (PCB) via a plurality of bonding wires 430 connected, via a reverse bonding process known in the art for example, to a respective plurality of bonding pads 414 of flare-reducing image sensor 410. One or more bonding wires 430 are at least partially within image circle 472. Flare-reducing image sensor 410 includes a pixel array 212 parallel to a plane 410T, FIG. 5. Plane 410T is for example orthogonal to an optical axis of one or more microlenses (not shown) of pixel array 212. Plane 410T may be parallel to a top surface of flare-reducing image sensor 410.

Flare-reducing image sensor 410 and pixel array 212 have respective widths 410W and 212W, as shown in FIG. 4. A clearance 413 is between pixel array 212 and bonding wires 430, such that bonding wires 430 are separated from pixel array 212 by clearance 413. Bonding wires 430 extend a distance 430L from their respective bond locations on bonding bands 414.

Lens 470 has a focal length f, diameter D, and an optical axis 471 that is orthogonal to plane 410T. Flare-reducing image sensor 410 and lens 470 may function as image sensor 110 and lens 170 respectively of FIG. 1. In an embodiment, width 410W equals 6.2 mm, width 212W equals 5.6 mm, clearance 413 equals 0.21 mm, and diameter D equals 3.7 mm.

As shown in FIG. 5, flare-reducing imaging system 400 includes coverglass 340, between lens 470 and image sensor 210. Since bonding wires 430 are at least partially within image circle 472, lens 570 is capable of refracting a chief ray 580, a lower marginal ray 578, and an upper marginal ray 582 such that they are incident on bonding wire 430 at a location 431R. Location 431R is at a perpendicular distance $x_r$ from optical axis 471 and a height h above plane 410T, where h<<f. For example, h<f/20. Distance $x_r$ may also be a distance from a midpoint of the pixel array 212 and be within a region spanned by distance 430L denoted in FIG. 4. Coverglass 340 has a thickness 341 that is much less than f such that shift δx may be ignored in the following expression of chief ray angles and marginal ray angles. For example, thickness 341 is less than 300 μm.

Chief ray 580 propagates at a chief-ray-angle χ with respect to optical axis 471, where tan(χ)=$x_r$/f. Lower marginal ray 578 and upper marginal ray 582 propagate at angles $β_-$ and $β_+$ respectively with respect to optical axis 471. Angles $β_\pm$ satisfy Equation 1, where $F_\#$=f/D and f−h≅f.

$$\tan\beta_\pm(x_r) = \frac{x_r \mp \frac{1}{2}D}{f} = \tan\chi \mp \frac{1}{2F_n} \quad (1)$$

Bonding wire 430 is electrically connected to a bonding pad 414 of flare-reducing image sensor 410 and has a peak height above PCB 202 at a region 430P. Bonding wire 430 includes a region 431 in the vicinity of location 431R that forms an angle $\Phi_u(x_r)$ with respect to plane 410T. Angle $\Phi_u(x_r)$ is less than or equal to a maximum angle $\Phi_{max}=\frac{1}{2}β_+$. When angle $\Phi_u(x_r)$ exceeds $\Phi_{max}$, as illustrated in FIG. 3 (where $\Phi_3=\Phi_u$), region 431 reflects upper marginal ray 582 toward coverglass 340 and pixel array 212, such that coverglass 340 reflects part of upper marginal ray 582 toward pixel array 212. When angle $\Phi_u(x_r)$ equals $\Phi_{max}$, region 431 reflects upper marginal ray 582 toward coverglass 340 in direction orthogonal to plane 410T, as illustrated in FIG. 4. When angle $\Phi_u(x_r)$ is less than $\Phi_{max}$, region 431 reflects upper marginal ray 582 toward coverglass 340 and away from pixel array 212, which reduces the risk of bonding-wire flare and enables clearance 413 to be decreased without risk of said flare. In an embodiment, angle $\Phi_u(x_r)$ is less than $\Phi_{max}$ and clearance 413 is less than one hundred microns. For example, clearance 413 equals seventy microns.

Since $β_+(x_r)<χ(x_r)<β_-(x_r)$, requiring $\Phi_u(x_r)<\frac{1}{2}β_+(x_r)$ also ensures that $\Phi_u(x_r)<\frac{1}{2}χ(x_r)$ and $\Phi_u(x_r)<\frac{1}{2}β_-(x_r)$. Hence, when $\Phi_u(x_r)<\frac{1}{2}β_+(x_r)$, upper marginal ray 582, chief ray 580 and lower marginal ray 578 are reflected away from pixel array 212. This ensures that all rays transmitted by lens 470 and incident on bonding wire 430 at $x_r$ are reflected away from pixel array 212.

Short circuiting becomes a risk as angle $\Phi_u(x_r)$ approaches zero such that region 431 is close to parallel to plane 410T. To avoid this risk, angle $\Phi_u(x_r)$ has a critical minimum angle, which is for example five degrees, above which short circuiting is a low risk.

Figure 6:
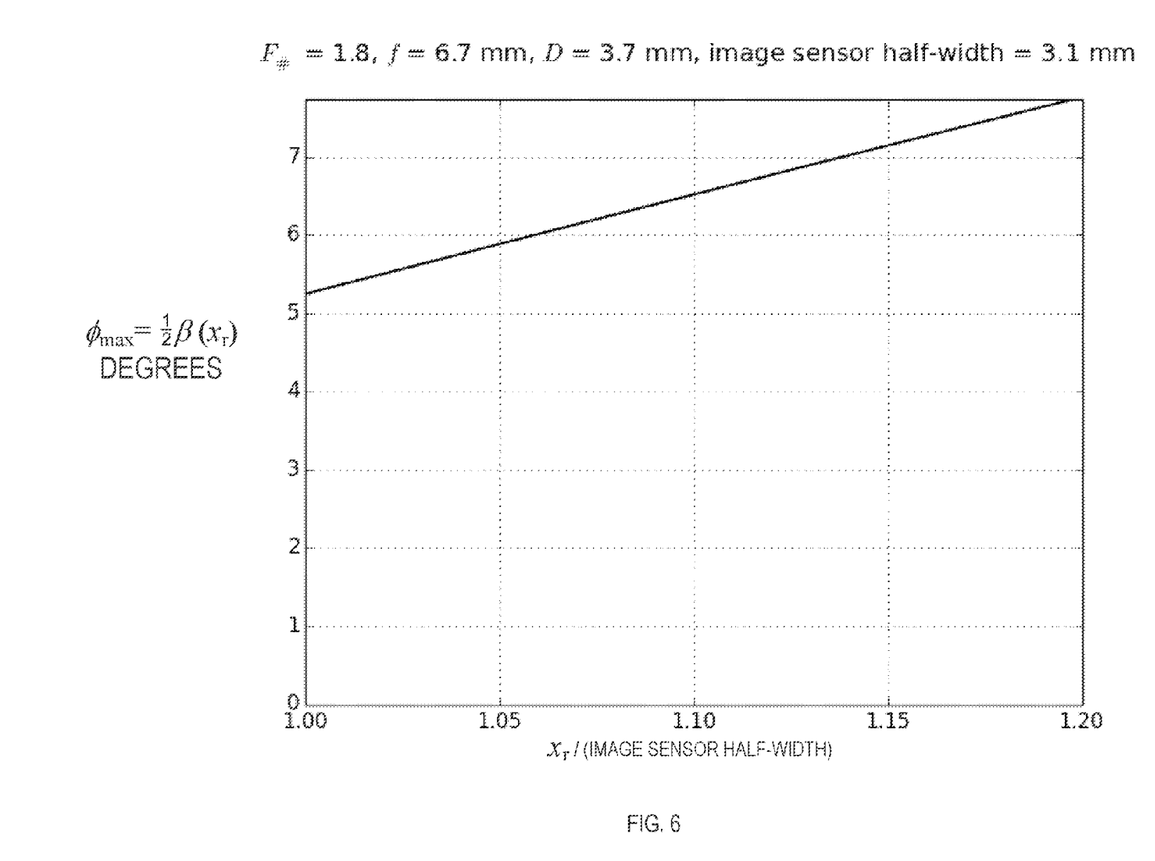
FIG. 6 is an exemplary plot of a maximum allowable angle of a bonding wire such that incident light is reflected away from the image sensor, in an embodiment.

FIG. 6 is an exemplary plot of $\Phi_{max}(x_r)=\frac{1}{2}β_+(x_r)$ vs. distance $x_r$, where upper marginal ray angle $β_+(x_r)$ is given by Eq. (1) and distance $x_r$ is normalized by half of sensor width 410W. In this example, characteristics of lens 470 are f=6.7 mm, D=3.7 mm, $F_\#$=1.8, and width 410W is 6.2 mm. In the range of $x_r$ values shown, marginal ray angle $β_+$ increases as $x_r$ increases, and hence so does $\Phi_{max}$, which indicates that the upper limit of angle $\Phi_u(x_r)$ of bonding wire 430 is most restrictive ($\Phi_{max}$ is smallest) closest to pixel array 212, that is, where bonding wire 430 attaches to bonding pad 414.

Figure 7:
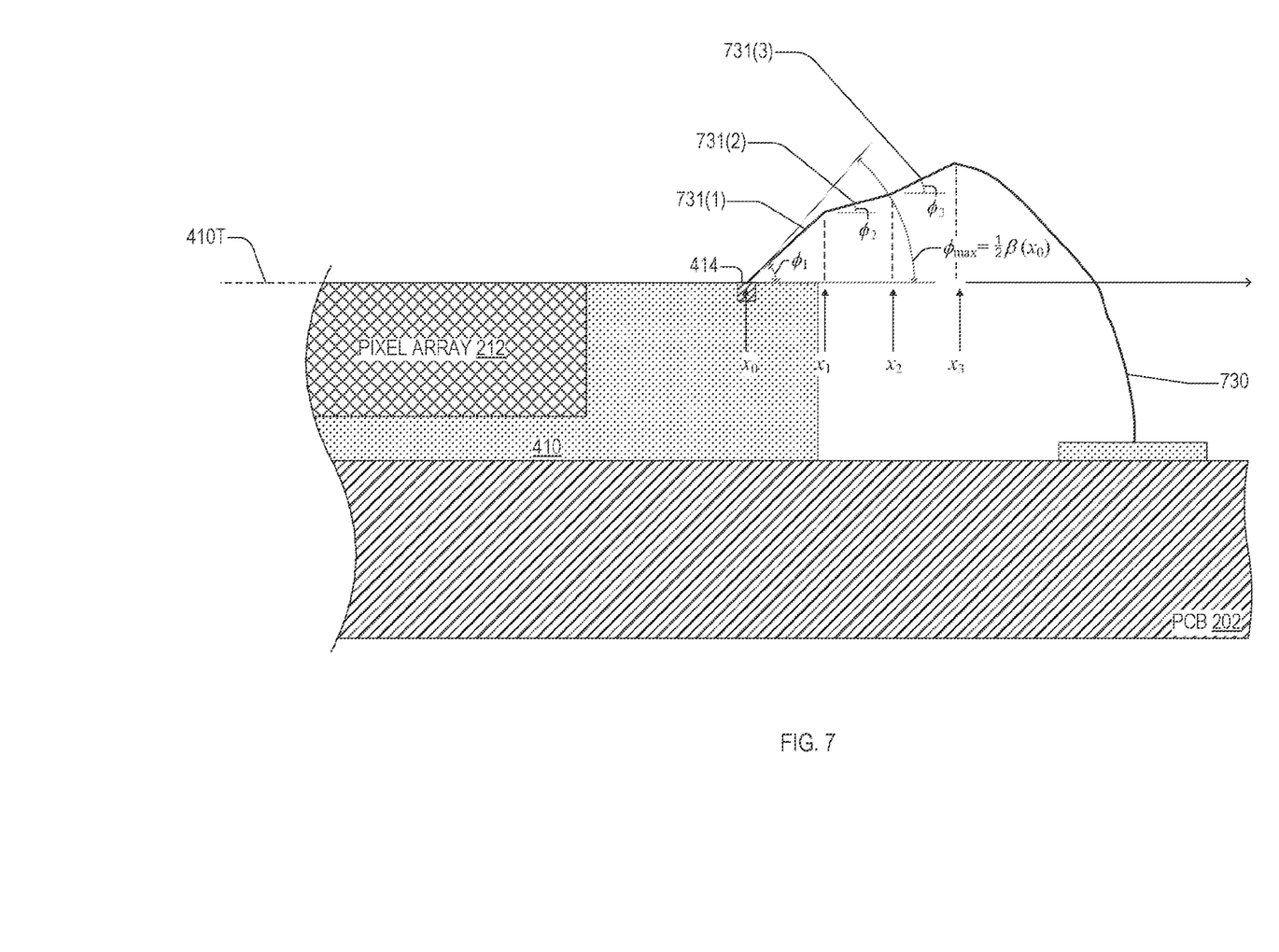
FIG. 7 shows a bonding wire attached to the flare-reducing image sensor of FIG. 4 having sections that form different angles with respect to the image sensor plane, in an embodiment.

In an embodiment, bonding wire 430 includes a plurality of regions, similar to region 431, between bonding pad 414 and region 430P, that form angles with respect to plane 410T between a critical minimum angle and $\Phi_{max}$. For example, FIG. 7 shows a bonding wire 730 having regions 731(1-3). Regions 731(1-3) span horizontal positions $x_0$-$x_1$, $x_1$-$x_2$, and $x_2$-$x_3$, respectively, where $x_1$, $x_2$, and $x_3$ are interface locations between adjacent regions 731. In a first example, each region 731(1-3) forms a respective angle Φ with plane 410T that satisfies $\Phi_i(x)<\frac{1}{2}β_+(x_0)$, which corresponds to the maximum allowed angle at x=$x_0$ where bonding wire 430 is attached to bonding pad 414. Since $β_+(x_0)<β_+(x>x_0)$ as shown in FIG. 6, that is, further away from the image sensor, regions 731(1-3) each also satisfy $\Phi_u(x)<\frac{1}{2}β_+(x)$.

In a second example, each region 731(1-3) forms a respective angle Φ with plane 410T that satisfies $\Phi_i(x)<\frac{1}{2}β_+(x_{i-1})$. For example, region 731(2) is a linear region forming an angle $\Phi_2(x)<\frac{1}{2}β_+(x_1)$. Bonding wire 730 is shown with three linear regions for illustrative purposes. Bonding wire 730 may have more than three linear regions, for example, so many that bonding wire 730 is best represented by a continuous curve w(x) with an angle $\Phi_u(x)$ determined by its slope $$w'(x) = \frac{dw(x_r)}{dx},$$

that is, $\Phi_u(x)$=arctan(w'(x)).

Bonding wire 730 may include a non-qualifying region that forms an angle with plane 410T that exceeds $\Phi_{max}$. For example, an interface location such as $x_1$, $x_2$, and $x_3$ may have a local slope that exceeds the slope of an adjacent region 731 such that the angle with respect to plane 410T at the interface region exceeds $\Phi_{max}$. As such regions can potentially cause bonding wire flare, the length of these regions should be minimized. In an embodiment, the length of such regions is less than ten percent of the length of bonding wire 730 between positions $x_0$ and $x_3$.

Figure 8:
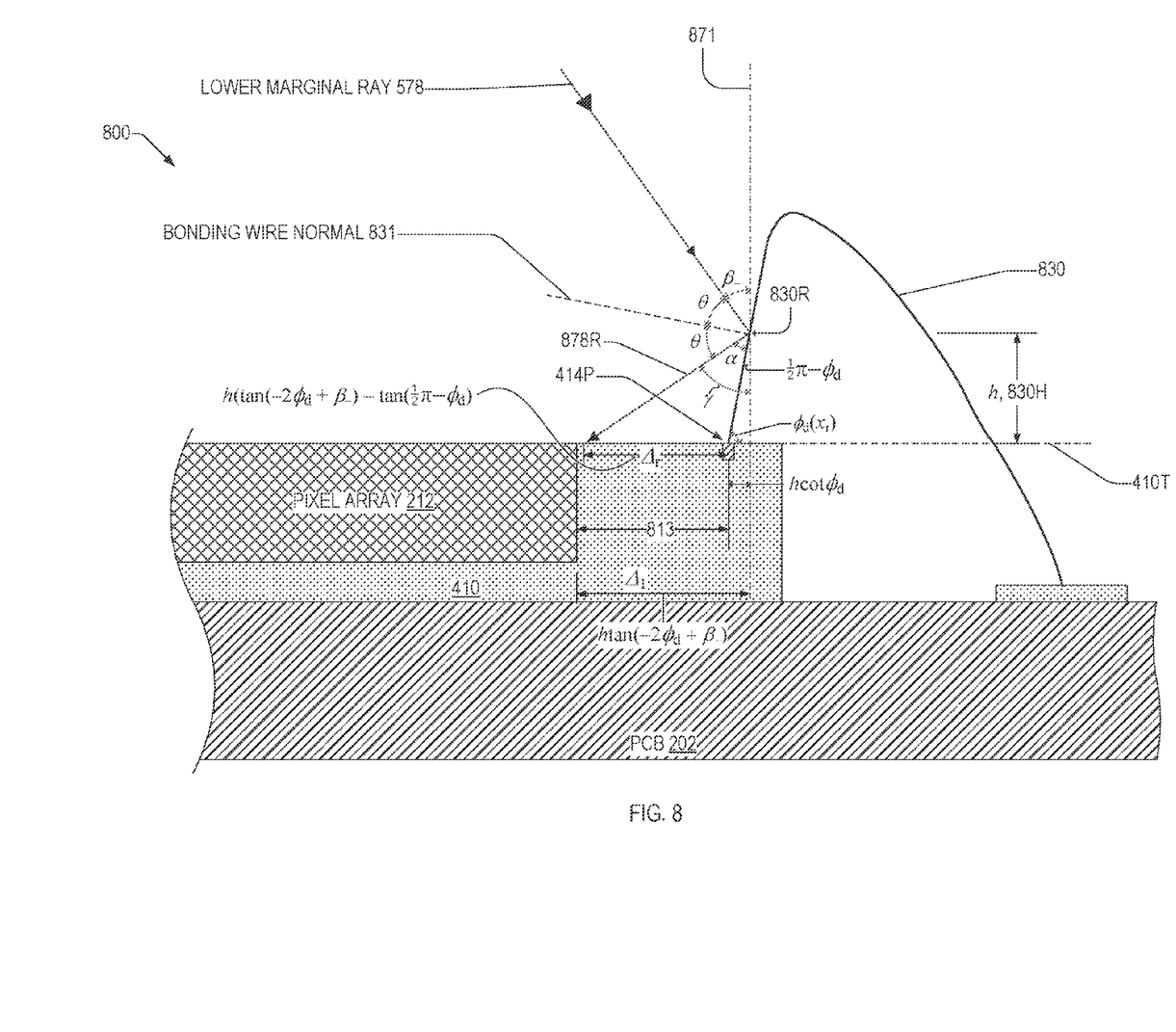
FIG. 8 is a cross-sectional view of a flare-reducing image sensor having bonding wires that reflect light toward a clearance between the bonding wire and the image sensor's pixel array, in an embodiment.

FIG. 8 is a cross-sectional view of a portion of a flare-reducing imaging system 800 that is identical to flare-reducing imaging system 400 except that bonding wires 430 are replaced with bonding wires 830. Bonding wire 830 contacts bonding pad 414 at a bonding point 414P and, at bonding point 414P, forms an angle $\Phi_d(x_r)$ with respect to plane 410T. Bonding point 414P is located at a clearance 813 from pixel array 212. In FIG. 8 angle $\Phi_d(x_r)$ is slightly greater than a minimum angle $\Phi_{min}$ required to prevent detection of stray light, as discussed below.

Lower marginal ray 578 is incident on bonding wire 830 at a point 830R located a height 830H (herein also referred to as h) above plane 410T. In the horizontal direction, point 830R is a distance h cot $\Phi$ from bonding point 414P and a distance $\Delta_1$ from pixel array 212, where $\Delta_1 = -h\tan(2\Phi_d - \beta_-)$. Point 830R is distance $x_r$ from optical axis 471, where distance $x_r$ in part determines marginal ray angle $\beta_-$ as shown in Eq. (1).

As in FIG. 5, lower marginal ray 578 propagates at an angle $\beta_-$ with respect to optical axis 471, and lines parallel thereto, such as 871. With respect to a bonding-wire normal 831, upper marginal ray 582 is incident on bonding wire 830, and reflects therefrom as a reflected ray 878R at an angle $\theta$ with respect to bonding-wire normal 831. Reflected ray 878R forms an angle $\alpha$ with bonding wire 830 and is incident on plane 410T at a horizontal distance $\Delta_r$ from bonding point 414P. In FIG. 8

$$\alpha = \frac{\pi}{2} - \theta$$

and $$\beta_- + 2\theta + \alpha + \left(\frac{\pi}{2} - \phi_d\right) = \pi$$

such that $\Phi_d = \beta_- + \theta$ and $$\alpha = \frac{\pi}{2} + \beta_- - \phi_d.$$

Distance $\Delta_1$ is part of a right triangle opposite angle $$\gamma \doteq \alpha + \left(\frac{\pi}{2} - \phi_d\right) = -2\phi + \beta_- + \pi$$

such that $\Delta_1 = h\tan(-2\Phi_d + \beta_- + \pi) = h\tan(-2\Phi_d + \beta_-)$. The distance $$\Delta_r = \Delta_1 - h\tan\left(\frac{\pi}{2} - \phi_d\right)$$

such that the ratio $$\frac{\Delta_r}{h}$$

is expressed in Eq. (2) where and Eq. (1) defines $\beta_-$.

$$\frac{\Delta_r(\phi_d)}{h} = \tan(-2\phi_d + \beta_-) - \tan\left(\frac{\pi}{2} - \phi_d\right) \qquad (2)$$

When $\Delta_r$ exceeds clearance 813, reflected ray 878R is incident on pixel array 212 and results in bonding wire flare in images produced by flare-reducing image sensor 410. Hence, restricting $\Delta_r$ such that $\Delta_r$ is less than clearance 813 prevents such bonding wire flare. In an embodiment, angle $\Phi_d(x_r)$ exceeds a minimum angle $\Phi_{min}$ such that $\Delta_r(\Phi_d, \beta_-)$ is less than clearance 813. In this embodiment, angle $\Phi_d(x_r)$ may be also be less than $\Phi_{max} = \frac{1}{2}\beta_+(x_r)$. Clearance 813 may be treated to minimize reflections of light incident thereon, for example, by a surface treatment or additional layer as known in the art.

In an embodiment, $\Delta_r$ is reduced by minimizing angle $$\alpha = \left(\frac{\pi}{2} + \beta_- - \phi_d\right)$$

such that lower marginal ray 578 is incident at location 830R at a grazing angle. In such an embodiment, angle $\Phi$ approaches $$\left(\beta_- + \frac{\pi}{2}\right),$$

such that bonding wire angle $\Phi_d(x_r)$ exceeds ninety degrees.

Figure 9:
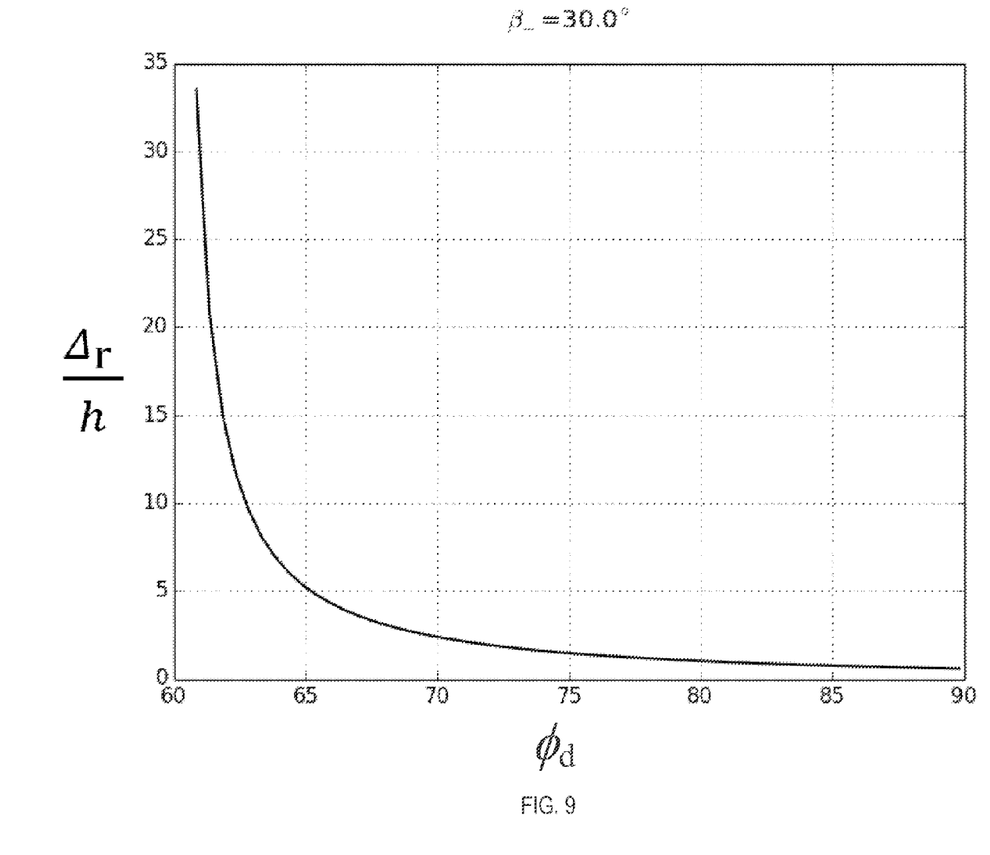
FIG. 9 is an exemplary plot of a minimum allowable angle of a bonding wire such that incident light is reflected toward a clearance between the bonding wire and the image sensor's pixel array, in an embodiment.

FIG. 9 is an exemplary plot of Eq. (2) where lower marginal ray angle $\beta_- = 30°$ for all values of angle $\Phi_d(x_r)$. In Eq. (2)

$$\left|\frac{\Delta_r(\phi_d)}{h}\right|$$

approaches infinity when reflected ray 878R propagates horizontally, i.e., parallel to plane 410T. This occurs when $$\gamma \doteq \alpha + \left(\frac{\pi}{2} - \phi_d\right) = (-2\phi_d + \beta_- + \pi) = \frac{\pi}{2}.$$

In such a case, we denote $\Phi_d$ as $\Phi_-^\infty$, where $$\phi_-^\infty = \frac{\beta_-}{2} + \frac{\pi}{4}.$$

For upper marginal ray angle $\beta_- = 30°$, $\Phi_-^\infty = 60°$, as shown in FIG. 9.

Bonding wire 830 may have a height $w(x_r)$ (of which height 830H is one value) above plane 410T and slope $w'(x_r)$ such that lower marginal rays incident thereon at respective positions $x_r$ (and corresponding angles $\beta_-(x_r)$) are reflected in a direction parallel to plane 410T. That is at one or more that positions $$x_r, \phi_d(x_r) = \phi_-^\infty = \frac{\beta_-(x_r)}{2} + \frac{\pi}{4}.$$

These reflected lower marginal rays propagate parallel to plane 410T, rather than reaching pixel array 212 by direct reflection from bonding wire 830, or by an intermediate reflection from coverglass 340.

Instead of determining $w(x_r)$ to reflect lower marginal rays parallel to plane 410T, $w(x_r)$ may be determined to reflect chief rays, with corresponding chief ray angles $\chi(x_r)$, parallel to plane 410T, such that $$\phi_d(x_r) = \phi_{CR}^\infty = \frac{\chi(x_r)}{2} + \frac{\pi}{4}.$$

In a afferent embodiment, $w(x_r)$ may be determined to reflect upper marginal rays, with corresponding upper marginal ray angles $\beta_+(x_r)$, parallel to plane 410T, such that $$\phi_d(x_r) = \phi_+^\infty = \frac{\beta_+(x_r)}{2} + \frac{\pi}{4}.$$

When upper marginal rays are reflected parallel to plane 410T, corresponding chief rays and lower marginal rays are reflected away from pixel array 212.

Alternatively, bonding wire 830 may have a height $w(x_r)$ above plane 410T and slope $w'(x_r)$ such that one or more lower marginal rays incident thereon at respective positions $x_r$ (and corresponding angles $\beta_-(x_r)$) are reflected such that distance $\Delta_r$ is less than clearance 813. In an embodiment, clearance 813 is between 200 μm and 600 μm. In the example of FIG. 9, if clearance 813 equals 400 μm and h=50 μm, $\Phi_d$ should exceed 63.3° to ensure that $\Delta_r$<400 μm.

Figure 10:
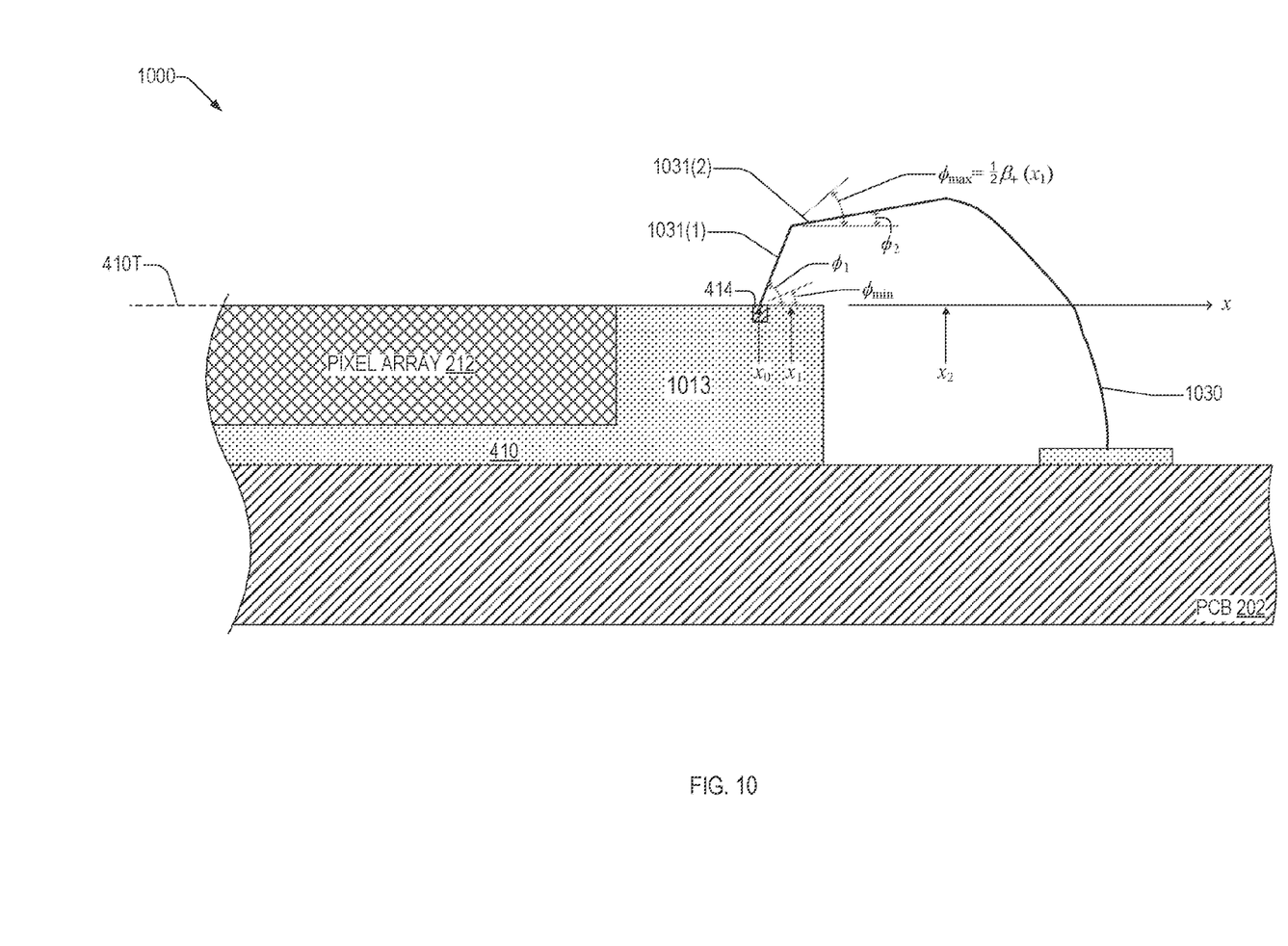
FIG. 10 shows a bonding wire attached to the flare-reducing image sensor of FIG. 8 having sections that form different angles with respect to the image sensor plane, in an embodiment.

FIG. 10 shows a cross-sectional view showing a portion of an imaging system 1000 that is identical to flare-reducing imaging system 400 except that bonding wires 430 are replaced with bonding wires 1030. Bonding wires 1030 include a region 1031(1) and a region 1031(2). Region 1031(1) spans horizontal positions $x_0$ and $x_1$ and satisfies the constraint that angle $\Phi_1 > \Phi_{min}$, for a predetermined clearance 1013 and a plurality of locations $x_r$ between $x_0$ and $x_1$ corresponding to where an upper marginal ray reflects off of region 1031(1). Note that $\Phi_{min}$ depends on lower marginal ray angle $\beta_-$, and hence on location $x_r$. Region 1031(2) spans interface locations $x_1$ and $x_2$ and satisfies the constraint that angle $\Phi_2 < \frac{1}{2}\beta_+(x_1)$, for a plurality of locations $x_r$ between $x_1$ and $x_2$ corresponding to where an upper marginal ray reflects off of region 1031(2).

Bonding wire 1030 may include a non-qualifying region that forms an angle with plane 410T that is not between $\Phi_{min}$ and $\Phi_{max}$. For example, one or more interface locations $x_1$ and $x_2$ may have a local slope $w'(x_r)$ that exceeds the slope of an adjacent region 1031 such that the angle with respect to plane 410T at the interface region not between $\Phi_{min}$ and $\Phi_{max}$. As such regions can potentially cause bonding wire flare, the length of these regions should be minimized. In an embodiment, the length of such non-qualifying regions is less than ten percent of the length of bonding wire 1030 between positions $x_0$ and $x_2$.

Combinations of Features:

Features described above as well as those claimed below may be combined in various ways without departing from the scope hereof. The following examples illustrate some possible, non-limiting combinations:

(A1) A flare-reducing imaging system includes an image sensor, a lens, and a bonding wire. The image sensor has a pixel array formed on a top surface of a substrate that includes a bonding pad on the substrate top surface between the pixel array and an edge of the substrate. The lens is above the pixel array and has an optical axis orthogonal thereto. The bonding wire is electrically connected to the bonding pad and has a region that forms a non-zero angle with respect to the substrate top surface and extends away from the optical axis. The non-zero angle is in at least one of a lower and an upper angular range for minimizing reflection of incident light on the region from reaching the image sensor. The lower angular range is selected such that the region reflects the incident light away from the pixel array toward a plane including the lens. The upper angular range is selected such that the region reflects the incident light to a clearance between the bonding pad and the pixel array.

(A2) In the flare-reducing imaging system denoted by (A1), the non-zero angle may exceed five degrees.

(A3) In a flare-reducing imaging system denoted by one of (A1) and (A2), the region may be between (a) the bonding pad and (b) a peak-height region of the bonding wire between the image sensor and the lens.

(A4) In a flare-reducing imaging system denoted by one of (A1) through (A3), the lower angular range may have an upper limit of $\frac{1}{2}\beta_+$, where $\beta_+$ is the angle between an upper marginal ray and the optical axis.

(A5) In the flare-reducing imaging system denoted by (A4), in which the lens has a focal length f and a diameter D, the upper marginal ray may be incident on the bonding wire at a perpendicular distance $x_r$ from the optical axis and at a height h<<f above the top surface, angle $\beta_+$ may satisfy tan $$\beta_+ = \frac{x_r - \frac{1}{2}D}{f}.$$

(A6) In a flare-reducing imaging system denoted by one of (A5) and (A6), the clearance may be less than one hundred micrometers.

(A7) In a flare-reducing imaging system denoted by one of (A1) through (A6), the upper angular range may have a minimum angle $\Phi_{min}$ with respect to the substrate top surface, such that the clearance exceeds $h(\tan(\pi - 2\Phi_{min} + \beta_-) - \cot \Phi_{min})$, where $\beta_-$ is the propagation angle, with respect to the optical axis, of a lower marginal ray incident on the region at a height h above the top surface.

(A8) In a flare-reducing imaging system denoted by (A7), in which the lens has a focal length f and a diameter D, and the incident light reflects off the bonding wire at a perpendicular distance $x_r$ from the optical axis and at a height h<<f above the top surface, angle $\beta_-$ may satisfy $$\tan\beta_- = \frac{x_r + \frac{1}{2}D}{f}.$$

(A9) In a flare-reducing imaging system denoted by one of (A7) and (A8), clearance may be less than six hundred micrometers.

(B1) A flare-reducing image sensor capable of capturing an image formed by a lens having an optical axis orthogonal thereto includes a substrate and a bonding wire. The substrate has a pixel array formed thereon, and includes a bonding pad on a top surface of the substrate between the pixel array and an edge of the substrate. The bonding wire is electrically connected to the bonding pad and has a region forming a non-zero angle with respect to the substrate top surface and extending away from the pixel array. The non-zero angle is in at least one of a lower and an upper angular range for minimizing reflection of incident light on the region from reaching the image sensor. The lower angular range is selected such that the region reflects the incident light away from the pixel array toward a plane including the lens. The upper angular range is selected such that the region reflects the incident light to a clearance between the bonding pad and the pixel array.

(B2) In the flare-reducing image sensor denoted by (B1), the non-zero angle may exceed five degrees.

(B3) In a flare-reducing image sensor denoted by one of (B1) and (B2), the region may be between (a) the bonding pad and (b) a peak-height region of the bonding wire above a plane containing the substrate top surface.

(B4) In a flare-reducing image sensor denoted by one of (B1) through (B3), the lower angular range may have an upper limit of ½β₊, where β₊ is the angle between an upper marginal ray and an image sensor normal.

(B5) In the flare-reducing image sensor denoted by (B4), in which the lens has a focal length f and a diameter D, the upper marginal ray is incident on the bonding wire at a perpendicular distance $x_r$ from the optical axis and at a height h<<f above the top surface, angle β₊ may satisfy $$\tan\beta_+ = \frac{x_r - \frac{1}{2}D}{f}.$$

(B6) In a flare-reducing image sensor denoted by one of (B5) and (B6), the clearance may be less than one hundred micrometers (B7) In a flare-reducing image sensor denoted by one of (B1) through (B6), the upper angular range may have a minimum angle $\Phi_{min}$ with respect to the substrate top surface, such that the clearance exceeds h(tan(π−2$\Phi_{min}$+β₋)−cot $\Phi_{min}$), where β₋ is the propagation angle, with respect to the optical axis, of a lower marginal ray incident on the region at a height h above the top surface.

(B8) In a flare-reducing image sensor denoted by (B7), in which the lens has a focal length f and a diameter D, and the incident light reflects off the bonding wire at a perpendicular distance $x_r$ from the optical axis and at a height h<<f above the top surface, angle β₋ may satisfy $$\tan\beta_- = \frac{x_r + \frac{1}{2}D}{f}.$$

(B9) In a flare-reducing image sensor denoted by one of (B7) and (B8), clearance may be less than six hundred micrometers.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A flare-reducing imaging system comprising:
   an image sensor having a pixel array formed on a top surface of a substrate that includes a bonding pad on the substrate top surface between the pixel array and an edge of the substrate;
   a lens above the pixel array and having an optical axis orthogonal thereto; and
   a bonding wire electrically connected to the bonding pad and having a region that forms a non-zero angle with respect to the substrate top surface and extends away from the optical axis, the non-zero angle being in at least one of a lower and an upper angular range for minimizing reflection of incident light on the region from reaching the image sensor, the lower angular range being selected such that the region reflects the incident light away from the pixel array toward a plane including the lens, and the upper angular range being selected such that the region reflects the incident light to a clearance between the bonding pad and the pixel array,
   the upper angular range having a minimum angle $\Phi_{min}$ with respect to the substrate top surface, such that the clearance exceeds h(tan(π−2$\Phi_{min}$+β₋)−cot $\Phi_{min}$), where β₋ is the propagation angle, with respect to the optical axis, of a lower marginal ray incident on the region at a height h above the top surface.

2. The flare-reducing imaging system of claim 1, the non-zero angle exceeding five degrees.

3. The flare-reducing imaging system of claim 1, the region being between (a) the bonding pad and (b) a peak-height region of the bonding wire between the image sensor and the lens.

4. The flare-reducing imaging system of claim 1, the lower angular range having an upper limit of ½β₊, where β₊ is the angle between an upper marginal ray and the optical axis.

5. The flare-reducing imaging system of claim 4, the lens having a focal length f and a diameter D, the upper marginal ray being incident on the bonding wire at a perpendicular distance $x_r$ from the optical axis and at a height h<<f above the top surface, and $$\tan\beta_+ = \frac{x_r - \frac{1}{2}D}{f}.$$

6. The flare-reducing imaging system of claim 4, the clearance being less than one hundred micrometers.

7. The flare-reducing imaging system of claim 1, the lens having a focal length f and a diameter D, the incident light reflecting off the bonding wire at a perpendicular distance $x_r$ from the optical axis and at a height h<<f above the top surface, and $$\tan\beta_- = \frac{x_r + \frac{1}{2}D}{f}.$$

8. The flare-reducing imaging system of claim 1, the clearance being less than six hundred micrometers.

9. A flare-reducing image sensor capable of capturing an image formed by a lens having an optical axis orthogonal thereto, comprising:
- a substrate having a pixel array formed thereon, and including a bonding pad on a top surface of the substrate between the pixel array and an edge of the substrate;
- a bonding wire electrically connected to the bonding pad and having a region forming a non-zero angle with respect to the substrate top surface and extending away from the pixel array, the non-zero angle being in at least one of a lower and an upper angular range for minimizing reflection of incident light on the region from reaching the image sensor, the lower angular range being selected such that the region reflects the incident light away from the pixel array toward a plane including the lens, and the upper angular range being selected such that the region reflects the incident light to a clearance between the bonding pad and the pixel array, the upper angular range having a minimum angle $\Phi_{min}$ with respect to the substrate top surface, such that the clearance exceeds $h(\tan(\pi-2\Phi_{min}+\beta_-)-\cot \Phi_{min})$, where $\beta_-$ is the propagation angle, with respect to the optical axis, of a lower marginal ray incident on the region at a height h above the top surface.

10. The flare-reducing image sensor of claim 9, the non-zero angle exceeding five degrees.

11. The flare-reducing image sensor of claim 9, the region being between (a) the bonding pad and (b) a peak-height region of the bonding wire above a plane containing the substrate top surface.

12. The flare-reducing image sensor of claim 9, the lower angular range having an upper limit of ½$\beta_+$, where $\beta_+$ is the angle between an upper marginal ray and an image sensor normal.

13. The flare-reducing image sensor of claim 12, the lens having a focal length f and a diameter D, the upper marginal ray being incident on the bonding wire at a perpendicular distance $x_r$ from the optical axis and at a height h<<f above the top surface, and $$\tan\beta_+ = \frac{x_r - \frac{1}{2}D}{f}.$$

14. The flare-reducing image sensor of claim 12, the clearance being less than one hundred micrometers.

15. The flare-reducing image sensor of claim 9, the lens having a focal length f and a diameter D, the incident light reflecting off the bonding wire at a perpendicular distance $x_r$ from the optical axis and at a height h<<f above the top surface, and $$\tan\beta_- = \frac{x_r + \frac{1}{2}D}{f}.$$

16. The flare-reducing image sensor of claim 9, the clearance being less than six hundred micrometers.

17. A flare-reducing imaging system comprising:
- an image sensor having a pixel array formed on a top surface of a substrate that includes a bonding pad on the substrate top surface between the pixel array and an edge of the substrate;
- a lens above the pixel array and having an optical axis orthogonal thereto; and
- a bonding wire electrically connected to the bonding pad and having a region that forms a non-zero angle with respect to the substrate top surface and extends away from the optical axis, the non-zero angle being in at least one of a lower and an upper angular range for minimizing reflection of incident light on the region from reaching the image sensor,
- the lower angular range having an upper limit of ½$\beta_+$, where $\beta_+$ is the angle between an upper marginal ray and the optical axis, such that the region reflects the incident light away from the pixel array toward a plane including the lens, and
- the upper angular range being selected such that the region reflects the incident light to a clearance between the bonding pad and the pixel array.

* * * * *

UNITED STATES PATENT AND TRADEMARK OFFICE
CERTIFICATE OF CORRECTION

Page 1 of 1

PATENT NO. : 9,781,362 B1
APPLICATION NO. : 15/076911
DATED : October 3, 2017
INVENTOR(S) : Lin et al.

It is certified that error appears in the above-identified patent and that said Letters Patent is hereby corrected as shown below:

On the Title Page

Item (72) Inventor is corrected to read:
-- Chao-Hung Lin, San Ramon, CA(US);
Hong Jun Li, San Jose, CA(US);
Ping-Hsu Chen, San Jose, CA(US);
Denis Chu, Fremont, CA(US);
Ye Tao, Shanghai, CN --.

Signed and Sealed this
Thirtieth Day of April, 2019

Andrei Iancu
*Director of the United States Patent and Trademark Office*